United States Patent
Nagao et al.

(10) Patent No.: US 8,122,204 B2
(45) Date of Patent: Feb. 21, 2012

(54) SHADOW WRITE AND TRANSFER SCHEMES FOR MEMORY DEVICES

(75) Inventors: Mitsuhiro Nagao, Gifu-Prefecture (JP); Kenji Shibata, Kani (JP); Satoru Kawmoto, Owarashi (JP)

(73) Assignee: Spansion LLC, Sunnyvale, CA (US)

( * ) Notice: Subject to any disclaimer, the term of this patent is extended or adjusted under 35 U.S.C. 154(b) by 793 days.

(21) Appl. No.: 12/137,443

(22) Filed: Jun. 11, 2008

(65) Prior Publication Data

US 2009/0150701 A1 Jun. 11, 2009

(30) Foreign Application Priority Data

Jun. 11, 2007 (JP) .................................. 2007-154452

(51) Int. Cl.
G06F 13/00 (2006.01)
G06F 13/28 (2006.01)
G06F 1/00 (2006.01)
G06F 3/00 (2006.01)
G11C 7/10 (2006.01)
G11C 7/00 (2006.01)

(52) U.S. Cl. .......... 711/154; 711/165; 713/324; 710/20; 365/189.04; 365/189.14; 365/220

(58) Field of Classification Search .................. 711/154, 711/165, E12.002; 713/324; 365/189.04, 365/189.14, 220

See application file for complete search history.

(56) References Cited

U.S. PATENT DOCUMENTS

| | | | | |
|---|---|---|---|---|
| 2006/0282581 A1* | 12/2006 | Takemae | ........................ | 710/62 |
| 2007/0109900 A1* | 5/2007 | Sakurai et al. | ................ | 365/226 |
| 2007/0198770 A1* | 8/2007 | Horii et al. | .................... | 711/103 |
| 2009/0268502 A1* | 10/2009 | Miura et al. | ................... | 365/63 |

FOREIGN PATENT DOCUMENTS

| | | |
|---|---|---|
| JP | 02163849 | 6/1990 |
| JP | 04336622 | 11/1992 |

* cited by examiner

*Primary Examiner* — Edward Dudek, Jr.

(57) ABSTRACT

Systems and methods for controlling memory devices are disclosed. In one embodiment, a memory system comprises a memory controller for forwarding a command signal and an address signal and for receiving and forwarding a data signal, and a first memory device for receiving the command signal and the address signal from the memory controller, where the first memory device comprises a first command judging circuit for receiving and forwarding the data signal and for decoding the command signal. The memory system further comprises a second memory device for receiving the command signal and the address signal from the memory controller, where the second memory device comprises a second command judging circuit for receiving and generating the data signal and for decoding the command signal. The command signal, the address signal and the data signal are commonly connected to the first memory device and the second memory device.

61 Claims, 12 Drawing Sheets

SHADOW WRITE AND TRANSFER SCHEMES FOR MEMORY DEVICES

CLAIM OF PRIORITY

This application claims priority from Japanese patent application 2007-154452 filed on Jun. 11, 2007.

FIELD OF TECHNOLOGY

The present invention relates to semiconductor devices and methods, particularly to control of memory devices.

BACKGROUND

An automatic memory backup circuit disclosed in Japanese Unexamined Patent Publication No. 2 (1990)-16384 (hereinafter "prior art") includes a CPU, an I/O port connected to the CPU, five buffers, and other components. The first of the five buffers is connected to a multidata bus coupled to the I/O port output. The second buffer is connected to an output multidata bus of the first buffer. The third buffer is connected to an output multidata bus of the first buffer. A data memory having an address terminal is connected to a multi-address bus coupled to the I/O port output. An address input terminal is coupled to the second buffer output. A backup memory having an address terminal is connected to a multi-address bus coupled to the I/O port output. A data input terminal is connected to the third buffer output. The fourth buffer is connected to a data output terminal of the data memory. The fifth buffer is connected to the data output terminal of the backup memory, and its output is connected to the I/O port input with the fourth buffer output. The I/O port output is connected to the first to fifth buffers, and to the control terminals of the data memory and backup memory.

In such configuration of the automatic backup circuit, data can be simultaneously written to both RAM and EEPROM without resorting to the CPU. Further, by changing control setting of buffers and memories from the I/O port, the data can be loaded and saved by changing address buses without resorting to the CPU. However, the data memory and the backup memory are controlled individually by different control signals. From the output of the I/O port to the control terminals of the data memory and the backup memory, control lines are connected individually. Accordingly, the CPU must control the data memory and the backup memory individually, and further individually control the first to fifth buffers provided on the data bus. As a result, the control scheme may be complicated. Accordingly, it may require extra time to perform the simultaneous writing of the data memory and the backup memory using the automatic backup circuit disclosed in the prior art.

In addition, propagation time of data processed via the data bus must be controlled. The five buffers are necessary for the data bus to control the propagation time of the data in routing the data, thus adding to the complexity of the prior art circuit. Furthermore, the circuit configuration of the prior art may increase power consumption of the circuit as well as cause a delay in the data propagation.

SUMMARY

This summary is provided to introduce a selection of concepts in a simplified form that are further described below in the detailed description. This summary is not intended to identify key features or essential features of the claimed subject matter, nor is it intended to be used to limit the scope of the claimed subject matter.

One embodiment of the present invention is directed to a memory system comprising a memory controller for forwarding a command signal and an address signal and for receiving and forwarding a data signal, and a first memory device for receiving the command signal and the address signal from the memory controller, where the first memory device comprises a first command judging circuit for receiving and forwarding the data signal and for decoding the command signal. The memory system further comprises a second memory device for receiving the command signal and the address signal from the memory controller, where the second memory device comprises a second command judging circuit for receiving and generating the data signal and for decoding the command signal. The command signal, the address signal and the data signal are commonly connected to the first memory device and the second memory device. In addition, a first action of the first memory device and a second action of the second memory device commonly operate simultaneously in the same data latency and in the same cycle.

Another embodiment is directed to a memory device in a memory system composed of a memory controller and a plurality of memory devices, having a command signal, an address signal, and a data signal connected commonly, comprises a command recognition circuit for recognizing a specified command signal to other memory device out of the plurality of memory devices as a write command of own memory device. A write data signal from the memory controller to the other memory device is sent to the own memory device in the same data latency and the same cycle to execute a write operation. In addition, read data signal from the other memory device is sent to the own memory device in the same data latency and the same cycle to execute a write operation.

Yet another embodiment is directed to control method of memory devices in a memory system having a plurality of memory devices connected to a same memory controller for issuing a specified command comprising recognizing the specified command to other memory device as a write command of own memory, connecting a data signal from the memory controller and the other memory device, and sending the content of the data signal to the own memory device for allowing a write operation by the same data latency.

As illustrated in the detailed description, other embodiments pertain to schemes and circuits of a memory system that reduce a delay in data processing as well as power consumption in the memory device. By connecting a volatile memory and a nonvolatile memory to a memory controller in a configuration which enables the controller to access the volatile memory and the nonvolatile memory in parallel, shadowing of the nonvolatile memory during write operation of the volatile memory as well as shadowing of the volatile memory during read operation of the nonvolatile memory can be achieved, where the shadowing refers to processing same command signals, address signals and data signals at one of the two memories if the signals are being accessed by the other one of the two memories. As a result, a faster backup operation can be realized by the memory system at reduced power.

BRIEF DESCRIPTION OF THE DRAWINGS

Example embodiments are illustrated by way of example and not limitation in the figures of the accompanying drawings, in which like references indicate similar elements and in which.

Figure 1:
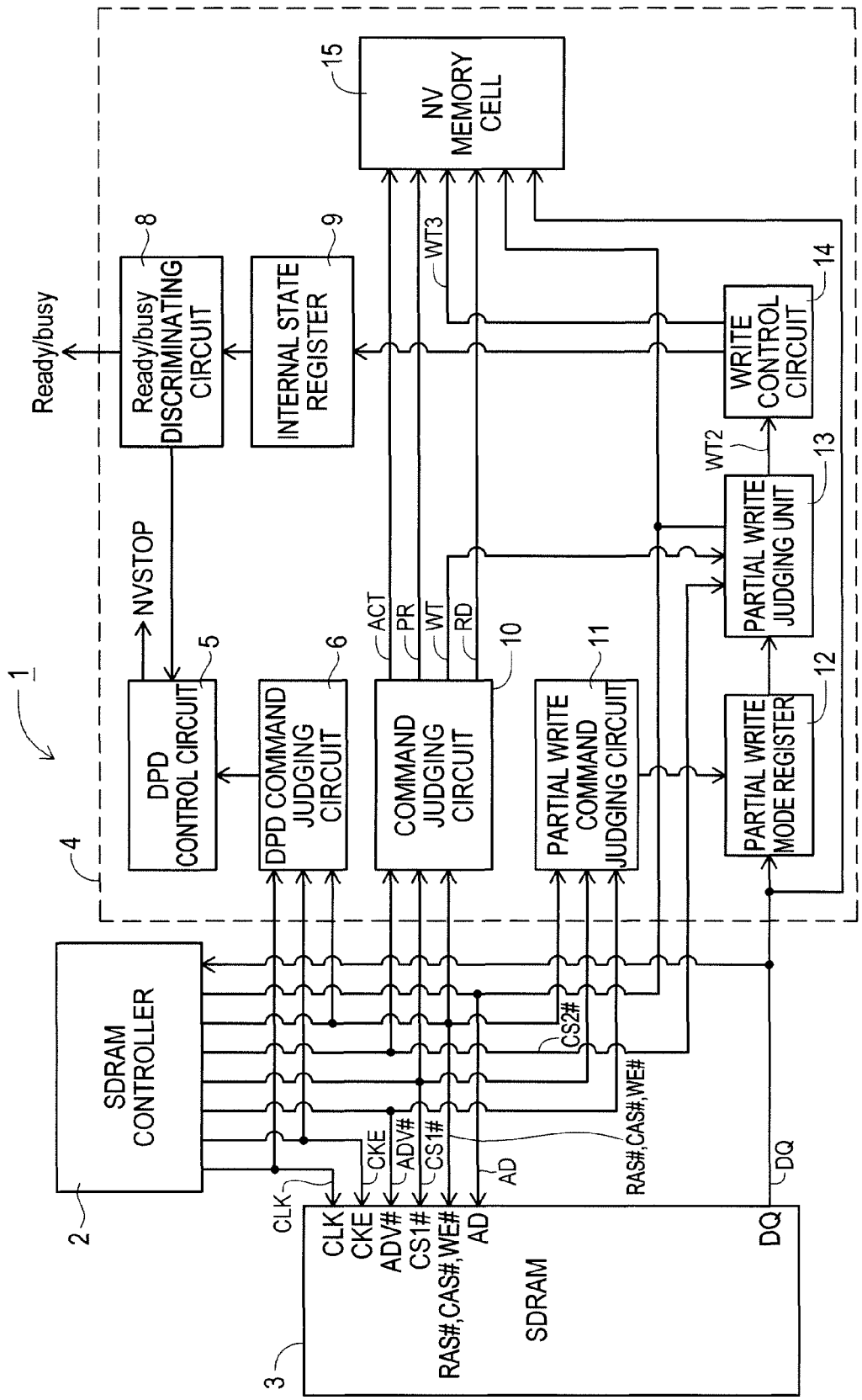
FIG. 1 is a block diagram of a memory system according to an embodiment 1.

Other features of the present embodiments will be apparent from the accompanying drawings and from the detailed description that follows.

DETAILED DESCRIPTION

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents, which may be included within the spirit and scope of the invention as defined by the claims. Furthermore, in the detailed description of the present invention, numerous specific details are set forth in order to provide a thorough understanding of the present invention. However, it will be obvious to one of ordinary skill in the art that the present invention may be practiced without these specific details. In other instances, well known methods, procedures, components, and circuits have not been described in detail as not to unnecessarily obscure aspects of the present invention.

Some portions of the detailed descriptions that follow are presented in terms of procedures, logic blocks, processing, and other symbolic representations for fabricating semiconductor devices. These descriptions and representations are the means used by those skilled in the art of semiconductor device fabrication to most effectively convey the substance of their work to others skilled in the art. A procedure, logic block, process, etc., is herein, and generally, conceived to be a self-consistent sequence of steps or instructions leading to a desired result. The steps are those requiring physical manipulations of physical quantities. Unless specifically stated otherwise as apparent from the following discussions, is appreciated that throughout the present application, discussions utilizing terms such as "forming," "performing," "producing," "depositing," or "etching," or the like, refer to actions and processes of semiconductor device fabrication.

Briefly stated, embodiments pertain to schemes and circuits of a memory system that reduce a delay in data processing as well as power consumption in the memory device. By connecting a volatile memory and a nonvolatile memory to a memory controller in a configuration which enables the controller to access the volatile memory and the nonvolatile memory in parallel, shadowing of the nonvolatile memory during write operation of the volatile memory as well as shadowing of the volatile memory during read operation of the nonvolatile memory can be achieved, where the shadowing refers to processing same command signals, address signals and data signals at one of the two memories if the signals are being accessed by the other one of the two memories. As a result, a faster backup operation can be realized by the memory system at reduced power.

The invention therefore presents a memory system including a plurality of memory devices having data signals connected mutually without resorting to a buffer. The memory system is capable of recognizing a command to another memory device as a command to its own memory device, and operates at the same data latency. Thus, the memory system of this invention has ready access to its memory devices, and its circuit configuration is simple. Moreover, the memory system reduces data propagation delay via its data bus as well as its power consumption during its backup operation.

For a memory system according to this invention having a first memory (e.g., a non-volatile memory), a second memory (e.g., a volatile memory) and a controller, when writing data from the controller to the second memory volatile, the first memory has a shadow write function. The shadow write function enables a simultaneous backup of the data written to the second memory to the first memory in the same cycle and under the same control system as the second memory and without requiring any particular I/O control. This is achieved when the second memory recognizes a write command from the memory controller to the second memory, and the first memory automatically generates its write command. Accordingly, the data can be backed up without relying on the data buffer in the memory controller and/or without issuing a write command from the memory command to each memory device.

When reading data from the first memory into the controller, the second memory has a shadow transfer function. The shadow transfer function enables a simultaneous loading of the data read by the first memory to the second memory in the same cycle and under the same control system as the first memory and without requiring any particular I/O control. This is achieved when the first memory recognizes a read command from the memory controller to the first memory, and the second memory automatically generates a write command from its read command. Accordingly, the data can be loaded from the first memory to the second memory without passing through the data buffer in the memory controller or without issuing a read command and write command from the memory command to each memory device.

When transferring data from an arbitrary address of the first memory to an arbitrary address of the second memory, the second memory has two functions. That is, a data transfer function for writing from the same connected I/O by the same read data and latency. The data transfer function also includes an address latency function for reading out the fetch control of an address which is a write destination address and delaying by a specified number of clocks from the read destination address. Accordingly, data can be transferred simultaneously in the same cycle and under the same control command system without requiring any particular I/O control. This is achieved when the first memory sends a read command from the memory controller to the first memory, and the second memory automatically generates a write command from its read command. Accordingly, the data can be transferred from an arbitrary address of the first memory to an arbitrary address of the second memory without passing through the data buffer in the memory controller or without issuing read command and write command from the memory command to each memory device.

Embodiment 1

FIG. 1 is a block diagram of a memory system 1 according to an embodiment 1. The memory system 1 includes an SDRAM controller 2, an SDRAM 3, and an NV memory 4. In the memory system 1, the SDRAM controller 2, the SDRAM 3, and the NV memory 4 are mutually connected directly by way of various clock signals, command signals, address signals AD, and data signals DQ. A chip select signal CS1# is connected to the SDRAM 3 and the NV memory 4. A chip select signal CS2# is connected to the NV memory 4. The chip select signal CS1# connected to the NV memory 4 may be omitted as described below. The NV memory 4 includes a DPD control circuit, a DPD command judging circuit 6, a Ready/busy discriminating circuit 8, an internal state register 9, a command judging circuit 10, a partial write command judging circuit 11, a partial write mode register 12, a partial write judging unit 13, a write control circuit 14, and an NV memory cell 15.

Figure 2:
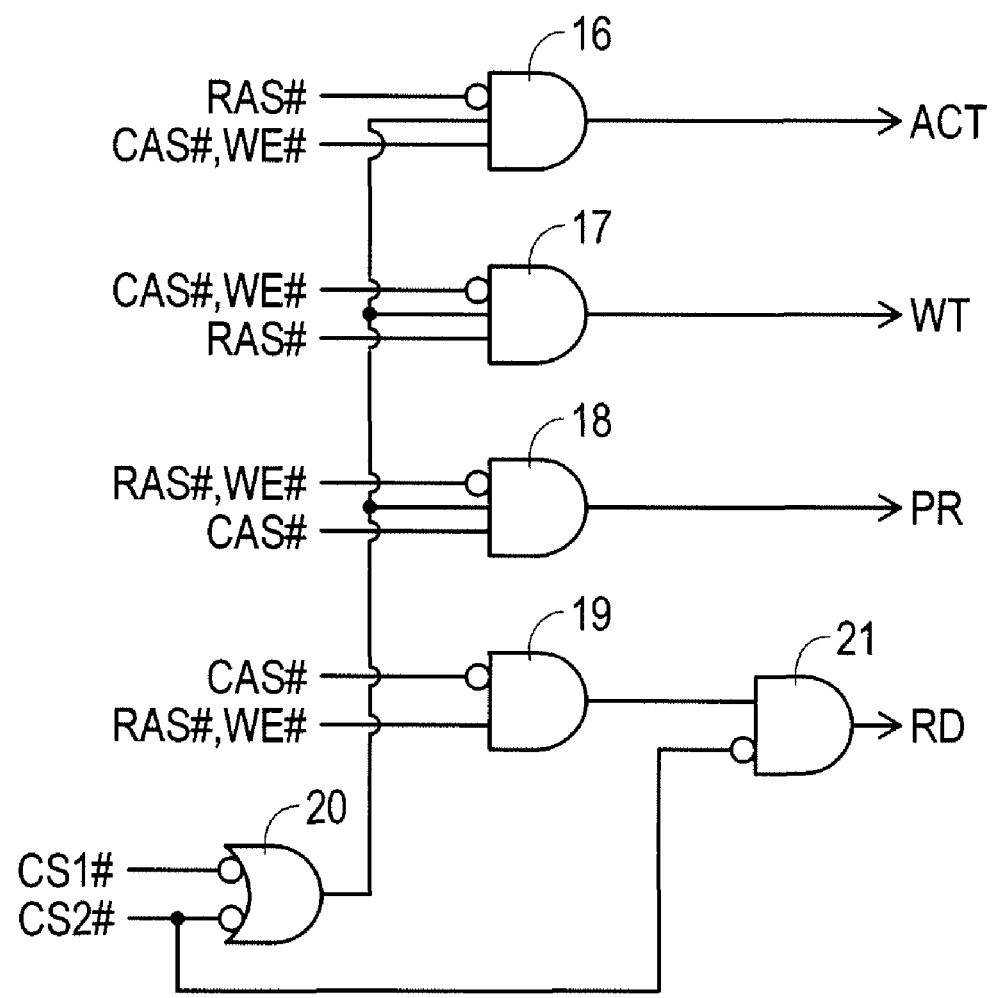
FIG. 2 is a circuit diagram showing an example of a command judging circuit according to the embodiment 1.

FIG. 2 shows an example of a circuit of the command judging circuit 10 provided in the NV memory 4. The command judging circuit 10 includes AND gates 16 to 19, and 21, and an OR gate 20. In the AND gate 16, while the chip select signal CS1# or the chip select signal CS2# is in low level state, when a row address select signal RAS# becomes low level, and a column address select signal CAS# and a write enable signal WE# become high level, an active signal ACT of its output is set to high level. In the AND gate 17, while the chip select signal CS1# or the chip select signal CS2# is in low level state, when the column address select signal CAS# and the write enable signal WE# become low level, and the row address select signal RAS# becomes high level, a write signal WT of its output is set to high level. In the AND gate 18, while the chip select signal CS1# or the chip select signal CS2# is in low level state, when the row address select signal RAS# and write enable signal WE# become low level, and column address select signal CAS# becomes high level, a precharge signal PR of its output is set to high level.

In the AND gate 21, while the chip select signal CS2# is in low level state, when the column address select signal CAS# becomes low level, and the row address select switch RAS# and the write enable signal WE# become high level, a read signal RD of its output is set to high level. Accordingly, in the operation other than the read operation, when the chip select signal CS1# is at low level, operation of the SDRAM 3 is also executed in the NV memory 4. That is, while the memory cell of the SDRAM 3 is written corresponding to the write data, concurrently, the memory cell of the NV memory 4 is written corresponding to the write data. At this time, the write address of the NV memory 4 is the same as the write address of the SDRAM 3. Further, the write data of the NV memory 4 is the same as the write data of the SDRAM 3. That is, both are the same in write latency and data latency.

For example, a deep power down (DPD) entry completion time of the NV memory 4 can be shortened, and the data can be protected when the power is down. A buffer is not used in the data signal DQ, and the command outputted from the SDRAM controller 2 is directly decoded, and the NV memory cell 15 is controlled. Accordingly, control of memory accesses becomes simple. Further, circuit configuration around the data signal becomes simple, and data propagation delay or power consumption may be curtailed.

Back to FIG. 1, the partial write command judging circuit 11 receives an address valid signal ADV#, an output enable signal OE# not shown, the write enable signal WE#, a lower bit signal LB# not shown, and an upper bit signal UB# not shown. A CR key 1 showing the type of partial refresh for defining the refresh active region (address region) of the SDRAM is read out in the fifth cycle of a verify sequence, and the partial write command judging circuit 11 commands reading of the CR key 1 to the partial write mode register 12 according to this sequence. The CR key 1 is read at $0^{th}$ bit and $1^{st}$ bit of the data signal DQ. In the following explanation, supposing $0^{th}$ bit of the data signal DQ to be DQ0, and $1^{st}$ bit of the data signal DQ to be DQ1, the CR key 1 is expressed in the alignment of DQ1, DQ0. At this time, when the CR key 1 is 00, it is 32M bit partial refresh, when the CR key 1 is 01, it is 16M bit partial refresh, when the CR key 1 is 10, it is 64M bit partial refresh, or when the CR key 1 is 11, it is sleep and is not refreshed.

In the case of 16M bit partial refresh, the data holding region is the address signal AD of 000000h to 0FFFFFh, in the case of 32M bit partial refresh, the data holding region is the address signal AD of 000000h to 1FFFFFh, and in the case of 64M bit partial refresh, the data holding region is address signal AD of 000000h to 3FFFFFh.

In the partial write judging unit 13, the address being presently active in the write operation on the SDRAM is set by the CR key 1, and it is judged whether the data holding region or not, and when the write object address of data signal DQ is in a range of the data holding region, and in the case of CS#1 at low level, the write signal WT outputted from the command judging circuit 10 is outputted as write signal WT2. In the case of CS2# at low level, the range of data holding region of partial refresh is not judged, and the write signal WT is outputted as a write signal WT2 in all case. As a result, the shadow write function of the low level CS1# is inactive in the area other than memory space declared by partial refresh, and only the necessary space of data compensation is the object of writing of the NV memory, and hence the power consumption of the NV memory can be saved. Incidentally, the partial write command judging circuit 11 can be simplified by other means as described below. By an extension mode register setting cycle specified in JEDEC Standard No. 79-4, the type of partial refresh of the SDRAM corresponding to the CR key 1 is stored in extension mode register (3-bit information from A0 to A2). By using this standard, the external terminals of the memory chip used in the JEDEC standard are only CLK, CS1, RAS#, CAS#, WE# and addresses, while ADV#, OE#, LB# and UB# are not needed. Further, in the external control terminal inputted to the partial write command judging circuit 11, the same as in the command judging circuit 10 mention below, the chip select signal CS1 can be eliminated. As a result, the NV memory can be pin-compatible with the SDRAM.

In the write control circuit 14, the write signal WT2 is outputted as the write signal WT3, and when the write operation is completed, the internal state register 9 is set ("1") at the same time. In addition, depending on the technology of the NV memory cell 15, the write operation may include a verify operation.

The DPD command judging circuit 6 judges whether the enable clock signal CKE, the chip select signal CS1#, and the write enable signal WE# are low level or not, and whether the row address select signal RAS# and the column address select signal CAS# are high level or not, and judges whether the memory controller 2 has commanded the DPD mode or not.

While the internal state register 9 is being set, the Ready/busy discriminating circuit 8 outputs a Ready/busy signal to outside, and informs the DPD control circuit 5 of Ready state. The DPD control circuit 5 outputs an NV memory stop signal NVSTOP if the mode is DPD, and Ready state is noticed from the Ready/busy discriminating circuit 8. When the NV memory stop signal NVSTOP is outputted, the power source circuit of the memory cell in the NV memory 4, various internal power sources, and circuits always consuming DC current are stopped temporarily. The memory controller may also control the power source of the NV memory by judging the Ready/busy signal. Specifically, an external power source of 1.8 V may usually be stepped down to about 1.2 V.

The Ready/busy discriminating circuit 8 may also be realized by other means as follows. The DPD control circuit 5 is connected to the internal state register 9 and the Ready/busy discriminating circuit 8. The DPD control circuit 5 is designed to output the NV memory stop signal NVSTOP when the output of the DPD command judging circuit 6 and the internal state register 9 are both set. The DPD control circuit 5 is connected to the Ready/busy discriminating circuit 8, and outputs an he NV memory stop signal NVSTOP, while the Ready/busy discriminating circuit 8 outputs a Ready/busy signal to outside. The means for noticing stop of the NV memory is not limited to the Ready/busy signal. For example, information capable of stopping or having stopped the NV memory is stored in the internal state register, the memory controller reads out the information in the internal state register, and the power source of the NV memory may be controlled according to this information. Accordingly, the power consumption in the NV memory 4 can be suppressed in the DPD mode. Besides, since the NV stop signal NVSTOP is outputted after setting of the internal state register 9, the data can be guaranteed securely by the shadow write function.

Figure 3:
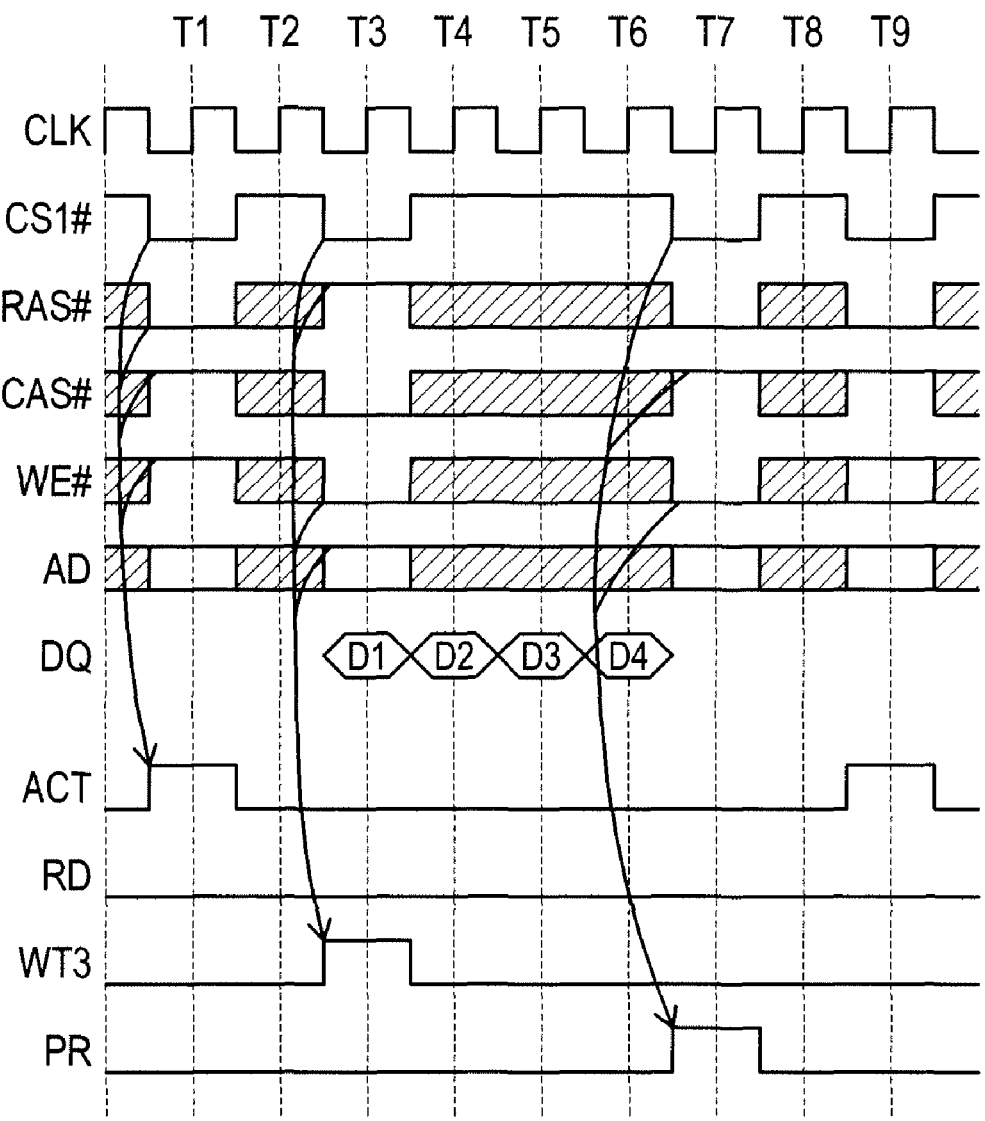
FIG. 3 is a timing chart showing an operation of the memory system of FIG. 1 according to the embodiment 1.

With reference to FIG. 3, the operation of the memory system 1 is explained. FIG. 3 is a timing chart of operation of the memory system 1. Herein, the clock signal CLK, the chip select signal CS1#, the row address select signal RAS#, the column address select signal CAS#, the write enable signal WE#, the address signal AD, and the data signal DQ are signals connected to the SDRAM controller 2. These signals CLK, CS1#, RAS#, CAS#, WE#, AD, and DQ are outputted from the SDRAM controller 2. However, DQ may also be issued from the memory device. The active signal ACT, the read signal RD, the write signal WT, and the precharge signal PR are signals connected to the NV memory cell 15. At timing T1, when the chip select signal CS1# and the row address select signal RAS# are at low level, and the column address select signal CAS# and the write enable signal WE# are at high level, the SDRAM 3 sets (latches) the row address, and the active signal ACT comes to high level, and the address corresponding to the row address of the NV memory cell 15 becomes active.

At timing T3, when the chip select signal CS1#, the column address select signal CAS# and the write enable signal WE# are at low level, and the row address select signal RAS# is at high level, the SDRAM 3 sets (latches) the column address, and the write signal WT comes to high level, and the data D1 on the data signal DQ is written into the address corresponding to the column address of the NV memory cell 15 in the same data latency as in the SDRAM 3. At timing T4 to T6, data D2 to D4 on the data signal DQ are written in the memory cell of the NV memory cell 15 in the same data latency as in the SDRAM 3. At timing T7, when the chip select signal CS1#, the row address select signal RAS# and the write enable signal WE# are at low level, and the column address select signal CAS# is at high level, the SDRAM 3 starts a precharge operation. The precharge signal PR comes to high level, and the NV memory cell 15 also starts the precharge operation. The SDRAM 3 performs the known write operation at timing T1 to timing T7. Thus, the same data is written into the same address of the SDRAM 3 and the NV memory cell 15 in the same data latency. Therefore, between the SDRAM 3 and the NV memory 4 connected to a common command bus, while writing from the SDRAM controller 2 to the SDRAM 3, the NV memory 4 can also shadow-write the same data as the SDRAM 3 at the same time.

Embodiment 2

Figure 4:
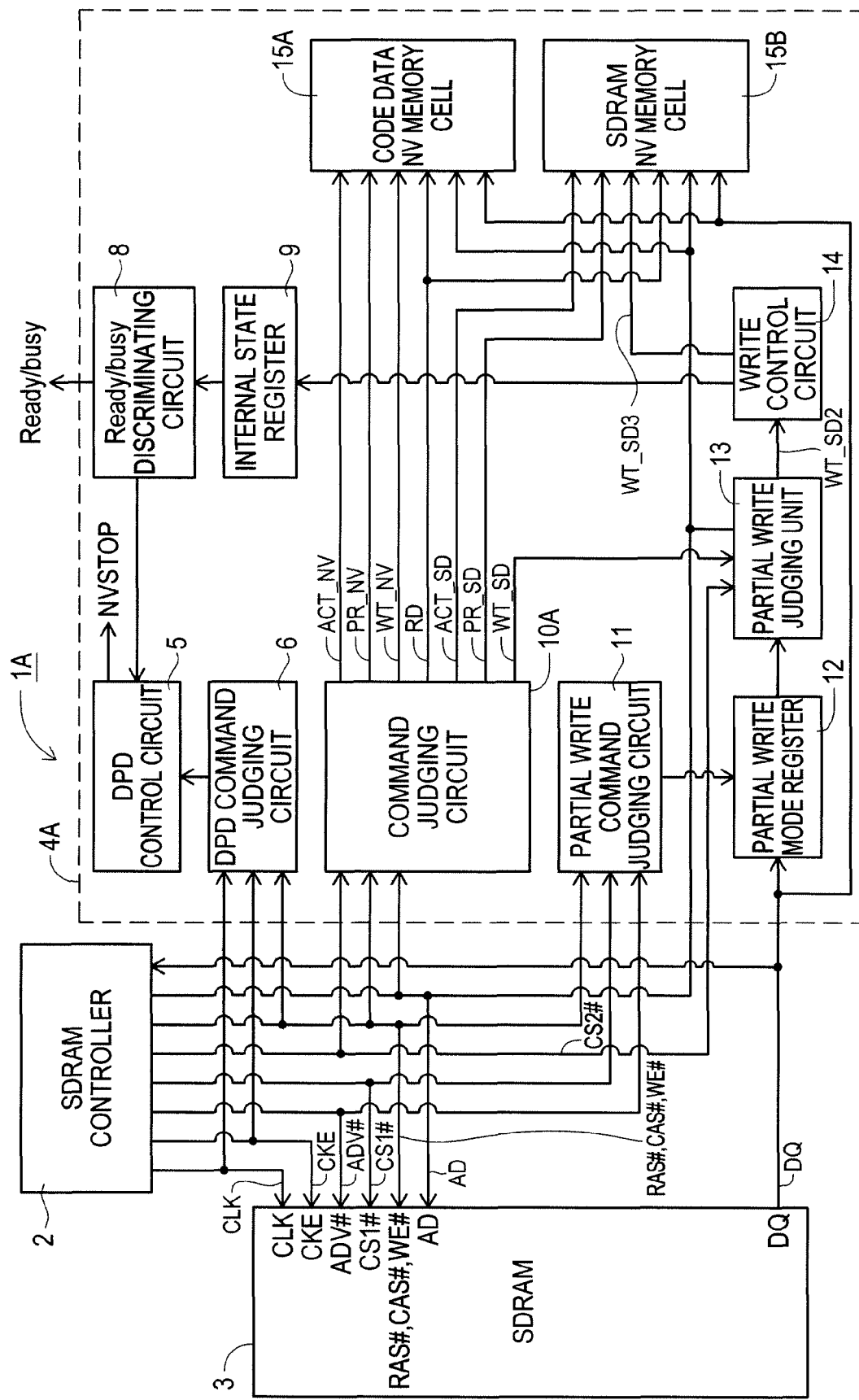
FIG. 4 is a block diagram of a memory system according to an embodiment 2.

FIG. 4 is a block diagram of the memory system 1A in an embodiment 2. The memory system 1A includes an SDRAM controller 2, an SDRAM 3, and an NV memory 4A. The SDRAM controller 2 and the SDRAM 3 are the same as in the embodiment 1. The NV memory 4A is different from the embodiment 1 in that its command judging circuit 10A and the NV memory cell in the embodiment 1 are divided into a code data NV memory cell 15A and an SDRAMNV memory cell 15B. The SDRAMNV memory cell 15B is a shadow address space having the same logical address for data backup of the SDRAM 3. Therefore different points from the embodiment 1 are mainly explained below, and the same parts are omitted or briefly described. In the memory system 1 in the embodiment 1, a chip select signal CS1# is inputted to the command judging circuit 10 provided in the NV memory 4, but in the memory system 1A in the embodiment 2, the chip select signal CS I# is not inputted to the command judging circuit 10A provided in the NV memory 4A.

Figure 5:
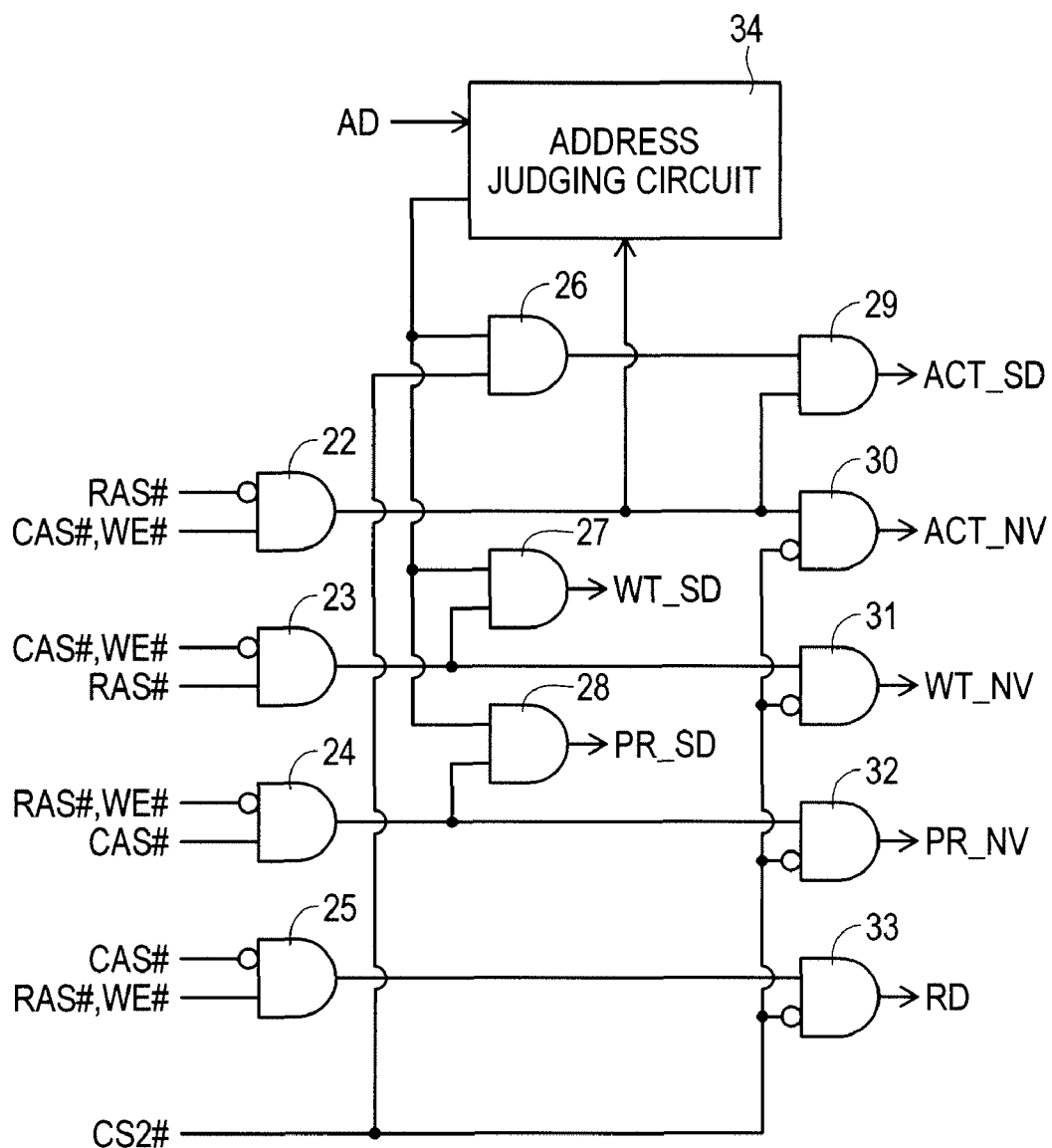
FIG. 5 is a circuit diagram showing an example of a command judging circuit according to the embodiment 2.

FIG. 5 shows an example of a circuit diagram of the command judging circuit 10A. The command judging circuit 10A includes AND gates 22 to 33, and an address judging circuit 34. The address judging circuit 34 receives an output from the AND gate 22, and when the address signal AD accesses the address space of the SDRAM 3, a high level is outputted. The address judging circuit 34 and the outputs of AND gates 22 to 25 described later operate regardless of chip select signals CS1#, CS2#. Accordingly, if chip select signal CS1# is not inputted to the NV memory 4, the NV memory 4 watches the write operation of the SDRAM 3, and the shadow write function can be started whenever necessary. At the AND gate 29, while the output of the address judging circuit 34 is at high level and the chip select signal CS2# is at high level, when the row address select signal RAS# comes to low level, and the column address select signal CAS# and the write enable signal WE# come to high level, its output or the active signal ACT_SD comes to high level.

At the AND gate 30, while the chip select signal CS2# is at low level, when the row address select signal RAS# comes to low level, and the column address select signal CAS# and the write enable signal WE# come to high level, its output or the active signal ACT_NV comes to high level. At the AND gate 27, while the output of the address judging circuit 34 is at high level, when the column address select signal CAS# and the write enable signal WE# come to low level, and the row address select signal RAS# comes to high level, its output or the write signal WT_SD comes to high level. At the AND gate 31, while the chip select signal CS2# is at low level, when the column address select signal CAS# and the write enable signal WE# come to low level, and the row address select signal RAS# comes to high level, its output or the write signal WT_NV comes to high level. At the AND gate 28, while the output of the address judging circuit 34 is at high level, when the row address select signal RAS# and the write enable signal WE# come to low level, and the column address select signal CAS# comes to high level, its output or the precharge signal PR_SD comes to high level. At the AND gate 32, while the chip select signal CS2# is at low level, when the row address select signal RAS# and the write enable signal WE# come to low level, and the column address select signal CAS# comes to high level, its output or the precharge signal PR_NV comes to high level. At the AND gate 33, while the chip select signal CS2# is at low level, when the column address select signal CAS# comes to low level, and the row address signal RAS# and the write enable signal WE# come to high level, its output or the read signal RD comes to high level.

Accordingly, in the operation other than read operation, when an address for accessing the SDRAM 3 is outputted, the write operation of the SDRAM 3 is executed also in the NV memory 4A. That is, while the memory cell of the SDRAM 3 is being written corresponding to the write data, the memory cell 15B of the NV memory 4A is written corresponding to the same write data. Therefore, the DPD entry completion time of the NV memory 4A is shortened, and the data can be protected in the event of momentary power failure. When reading out the back-up data from the SDRAMNV memory cell 15B, the controller selects the address space of the SDRAM 3 desired to be backed up, and the chip select signal CS2#, and issues a read access command to the device of the NV memory 4A. The detail is described below. When the chip select signal CS2# is at low level, the SDRAMNV memory cell 15B is mapped in 00000000h to 0FFFFFFFh, and the code date NV memory cell 15A is mapped in 10000000h to 1FFFFFFFh. That is, by setting the chip select signal CS2# at low level, when accessing 00000000h to 0FFFFFFFh, the SDRAMNV memory cell 15B can be accessed, or when accessing 10000000h to 1FFFFFFFh, the code data NV memory cell 15A can be accessed.

Figure 6:
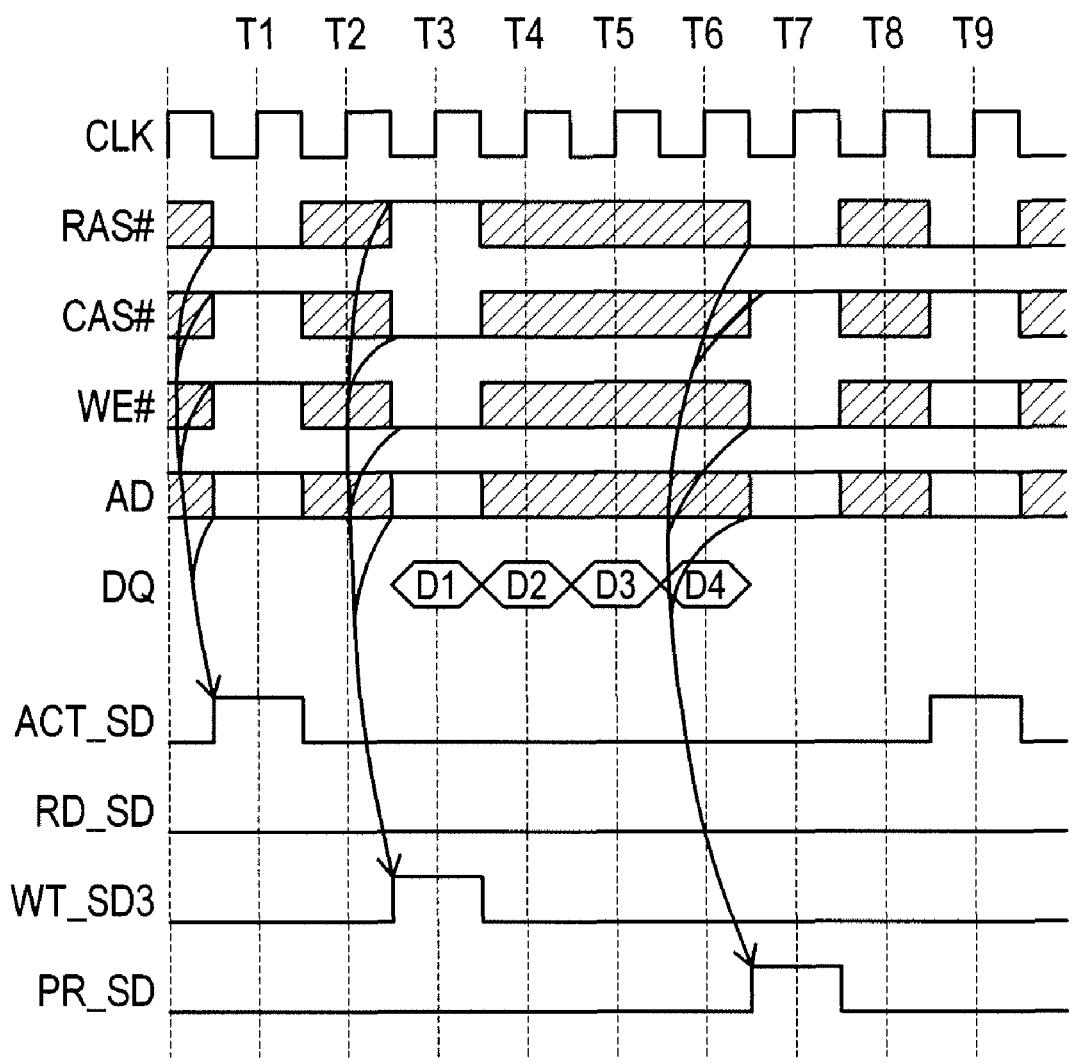
FIG. 6 is a timing chart showing an operation of the memory system of FIG. 4 according to the embodiment 2.

With reference to FIG. 6, the operation of the memory system 1A is explained. FIG. 6 is a timing chart of operation of the memory system 1A. The chip select signal CS1# is the same as in the embodiment 1 (FIG. 3) and is omitted. The clock signal CLK, the row address select signal RAS#, the column address select signal CAS#, the write enable signal WE#, the address signal AD, and the data signal DQ are signals connected to the SDRAM controller 2. The active signal ACT_SD, the read signal RD, the write signal WT_SD3, and the precharge signal PR_SD are signals connected to the NV memory cell 15. At timing T1, the address signal AD is in the address range of the SDRAM 3, and when the row address select signal RAS# is at low level, and the column address select signal CAS# and the write enable signal WE# are at high level, the SDRAM 3 sets (latches) the row address, and the active signal ACT_SD comes to high level, and the address corresponding to the row address of the SDRAMNV memory cell 15B becomes active. At timing T3, the address signal AD is in the address range of the SDRAM 3, and when the column address select signal CAS# and the write enable signal WE# are at low level, and the row address select signal RAS# is at high level, the column address is set (latched), and the write signal WT_SD comes to high level, and the data D1 on the data signal DQ is written into the address corresponding to the column address of the SDRAMNV memory cell 15B in the memory cell 15B in the same data latency as in the SDRAM 3.

At timing T4 to T6, data D2 to D4 on the data signal DQ are written in the memory cell of the SDRAMNV memory cell 15B in the same data latency as in the SDRAM 3. At timing T7, the address signal AD is in the address range of the SDRAM 3, and when the row address select signal RAS# and the write enable signal WE# are at low level, and the column address select signal CAS# is at high level, the SDRAM 3 starts precharge operation. The precharge signal PR_SD comes to high level, and the SDRAMNV memory cell 15B also starts the precharge operation. In the address signal AD at timing T7, the same bank address as the bank address inputted at timing T1 is inputted. The SDRAM 3 performs the known write operation at timing T1 to timing T7. Thus, the same data is written into the same address of the SDRAM 3 and the SDRAMNV memory cell 15B, by the control of the address signal AD, the row address select signal RAS#, the column address select signal CAS#, and the write enable signal WE#. Therefore, between the SDRAM 3 and the NV memory 4A connected to a common command bus, while writing from the SDRAM controller 2 to the SDRAM 3, the NV memory 4A can also shadow-write the same data as the SDRAM 3 at the same time. Further, the chip select signal CS1# inputted to the NV memory 4A in the embodiment 1 can be omitted. The chip select signal CS1# inputted to the partial write command judging circuit 11 can be also omitted as in the case of the command judging circuit 10A. As a result, the NV memory is pin-compatible with the SDRAM.

Embodiment 3

Figure 7:
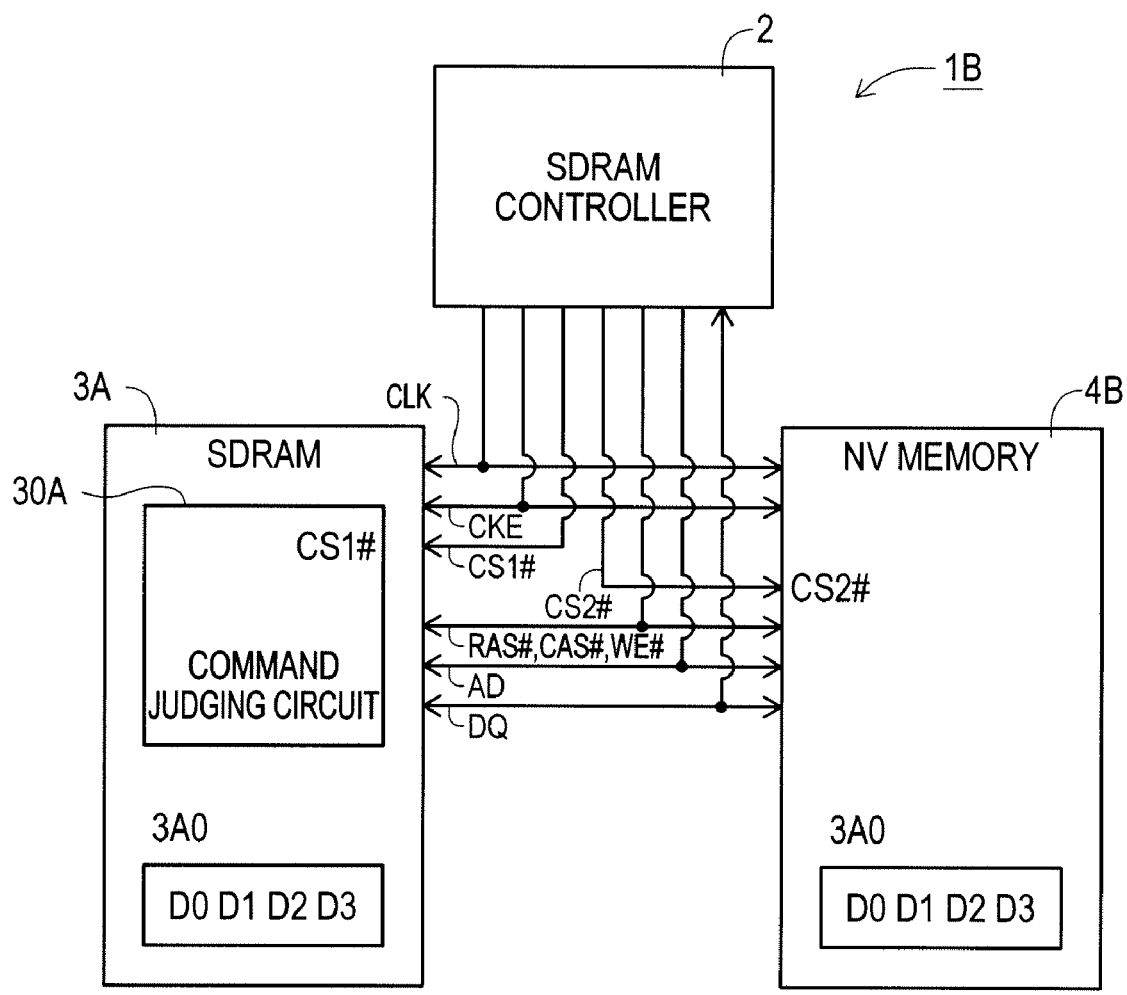
FIG. 7 is a block diagram of a memory system according to an embodiment 3.

FIG. 7 is a block diagram of a memory system 1B in the embodiment 3. The memory system 1B includes an SDRAM controller 2, an SDRAM 3A, and an NV memory 4B. In the memory system 1B, the SDRAM controller 2, the SDRAM 3A, and the NV memory 4B are connected directly with each other by way of various clock signals, command signals, address signals AD, and data signals DQ. The NV memory 4B has a command judging circuit not shown, for accessing the NV memory cell by decoding commands outputted from the SDRAM controller 2, that is, the row address select signal RAS#, the column address select signal CAS#, and the write enable signal WE#. The SDRAM 3A has a function of writing in the same address the data being read out from the NV memory 4B upon end of DPD. This function is realized by the command judging circuit 30A provided in the SDRAM 3A.

Figure 8:
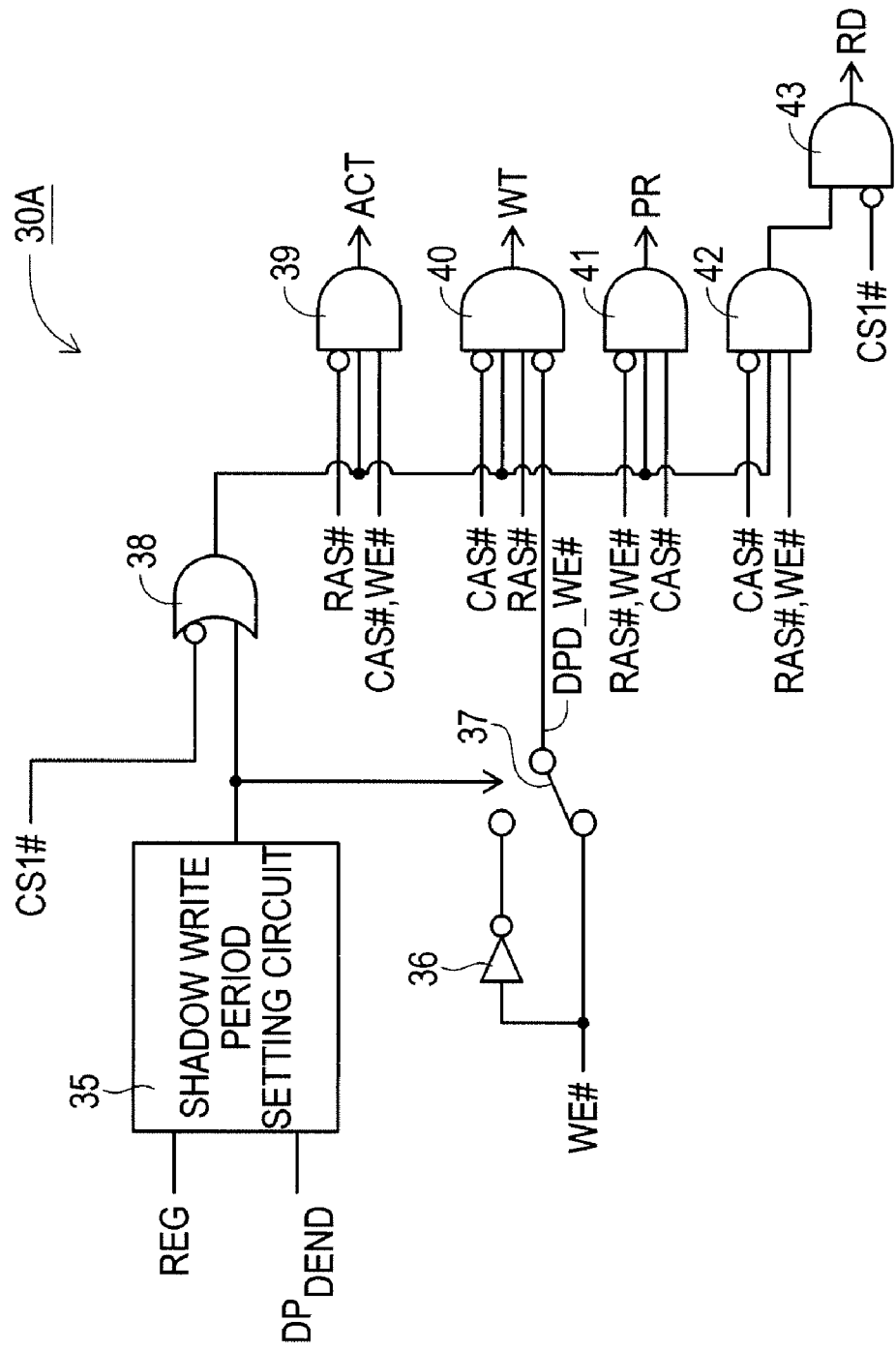
FIG. 8 is a circuit diagram showing an example of a command judging circuit according to the embodiment 3.

FIG. 8 shows an example of a circuit diagram of the command judging circuit 30A provided in the SDRAM 3A. The command judging circuit 30A includes a shadow write period setting circuit 35, an inverter 36, a switch 37, an OR gate 38, and AND gates 39 to 43. The shadow write period setting circuit 35 receives an DPD end signal DPDEND, and outputs a high level for the period determined by the register signal REG. The output of the shadow write period setting circuit 35 is connected to the switch 37 and OR gate 35. The switch 37 outputs a write enable signal WE# while the output signal of the shadow write period setting circuit 35 is at low level, and outputs an inverted signal of the write enable signal WE# through the inverter 36 while the output signal of the shadow write period setting circuit 35 is at high level. The OR gate 38 always outputs a high level while the output signal of the shadow write period setting circuit 35 is at high level, and the chip select signal CS1# is invalidated.

At the AND gate 39, while the output of the OR gate 38 is at high level, and when the row address select signal RAS# comes to low level, and the column address select signal CAS# and the write enable signal WE# come to high level, the output or the active signal ACT comes to high level. At the AND gate 40, while the output of the OR gate 38 is at high level, and when the column address select signal CAS# and the write enable signal DPD_WE# come to low level, and the row address select signal RAS# comes to high level, its output or the write signal WT comes to high level. At the AND gate 41, while the output of the OR gate 38 is at high level, and when the row address select signal RAS# and the write enable signal WE# come to low level, and the column address select signal CAS# comes to high level, its output or the precharge signal PR comes to high level. At the AND gate 42, while the output of the OR gate 38 is at high level, and when the column address select signal CAS# comes to low level, and the row address select signal RAS# and the write enable signal WE# come to high level, its output comes to high level. At the AND gate 43, while the chip select signal CS1# is at low level, and when the output of the AND gate 42 comes to high level, its output or the read signal RD comes to high level.

In such circuit configuration, when the DPD Exit of the SDRAM 3A is started, and a specified reset operation of the SDRAM 3A (initializing sequence specified in JEDEC) is terminated, the output signal of the shadow write period setting circuit 35 changes to high level. As a result, the chip select signal CS1# is invalidated, and the SDRAM 3A responds to the read command of the NV memory 4B. At the same time, the input of the switch 37 charges to high level. Accordingly, the write enable signal WE# is inverted, and the write command of the SDRAM 3A is activated in response to the read command of the NV memory 4B. The register signal REG determines the period of the output signal of the shadow write period setting circuit 35 being changing to high level. The register signal REG is given in the mode register setting cycle from the SDRAM controller 2 during a specified reset operation of the SDRAM 3A, and its register value shows address space in which data holding is guaranteed by the SDRAM 3A. That is, the wider the data guaranteed address space, the greater is the number of times of writing (number of cycles) of the SDRAM 3A from the NV memory 4B, thereby extending the time for invalidating the chip select signal CS1 # and inverting the write enable signal WE#.

In this context, the DPD end signal DPDEND and the register signal REG entered in the shadow write period setting circuit 35 may be exchanged in connection by conforming commonly to the output signal of the mode register applied from the SDRAM controller 2 in the mode register setting cycle. In the SDRAM controller 2, when transferring data of only the desired NV memory 4B to the SDRAM 3A by the shadow function, a mode register cycle for entry/eject to a shadow transfer mode should be inserted in the front and rear cycles. Further, the SDRAM 3A carries out a characteristic operation at the time of the write operation. Usually, there are data latency (RCL) for specifying the number of external clocks CLK from the read command to the data output to the data signal DQ in read access, and data latency (WCL) for entering the write data from the write command to the data signal DQ. In the invention, the SDRAM 3A has the latency changing means, and the SDRAM 3A is changed from the read latency value to the write latency value. If the read latency and write latency are different, the fetch of the write data is not matched if only the mode in the device is changed from the read mode to the write mode.

Figure 9:
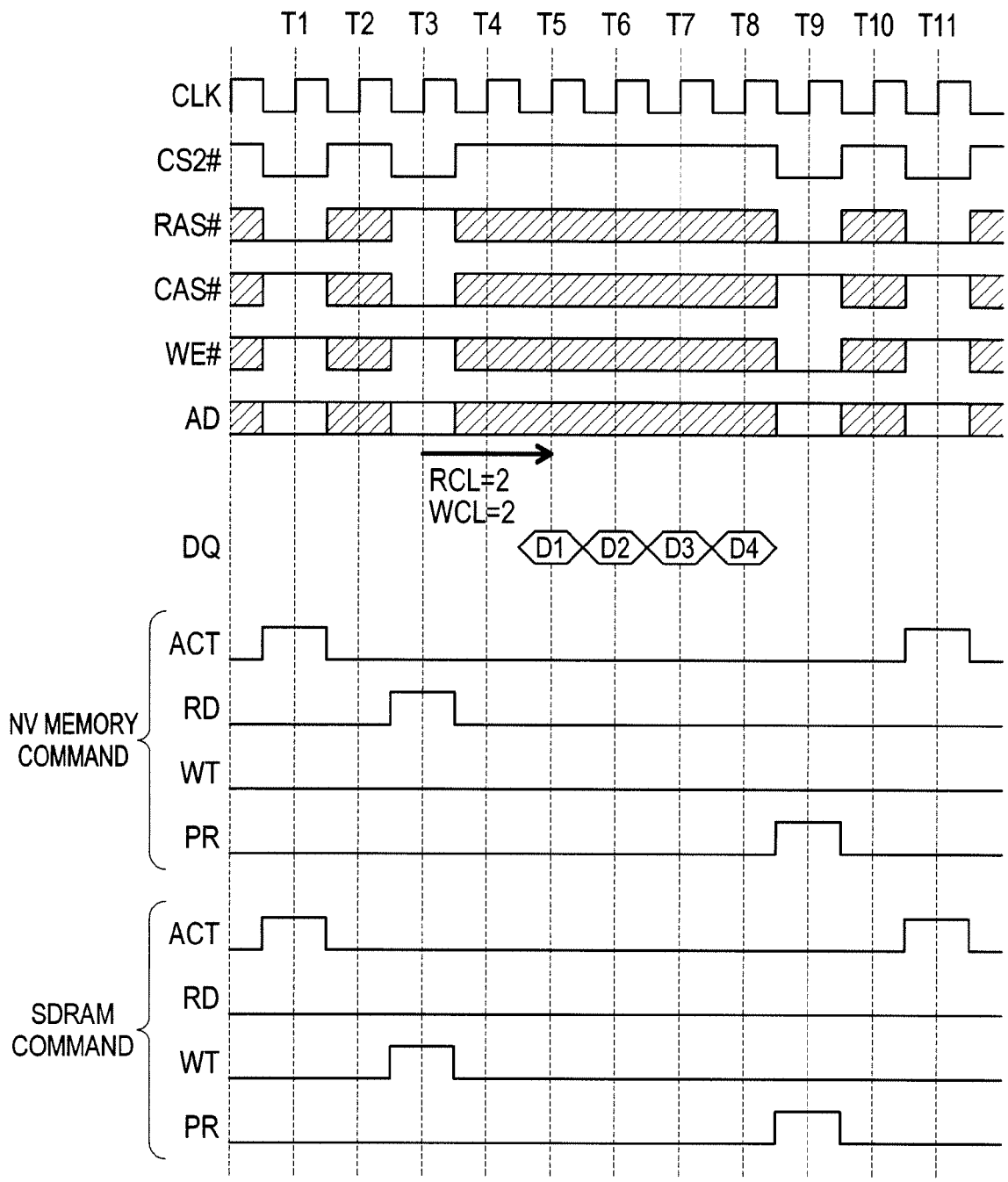
FIG. 9 is a timing chart showing an operation of the memory system of FIG. 7 according to the embodiment 3.

With reference to FIG. 9, the operation of the memory system 1B is explained. FIG. 9 is a timing chart of operation of the memory system 1B. The clock signal CLK, the chip select signal CS2#, the row address select signal RAS#, the column address select signal CAS#, the write enable signal WE#, the address signal AD, and the data signal DQ are signals connected to the SDRAM controller 2. In the middle stage, the active signal ACT, the read signal RD, the write signal WT, and the precharge signal PR are signals showing the memory commands of the NV memory 4B. In the lower stage, the active signal ACT, the read signal RD, the write signal WT, and the precharge signal PR are signals showing the memory commands when the output of the shadow write period setting circuit 35 of the SDRAM 3A is at high level.

At timing T1, the chip select signal CS2# and the row address select signal RAS# are at low level, and when the column address select signal CAS# and the write enable signal WE# are at high level, the active signal ACT of the NV memory 4B and the active signal ACT of the SDRAM 3A come to high level. Accordingly, the NV memory 4B and the SDRAM 3A set (latch) the row address. At timing T3, when the chip select signal CS2# and the column address select signal CAS# are at low level, and the row address select signal RAS# and the write enable signal WE# are at high level, in the NV memory 4B, the column address is set (latched), and the content of the memory cell specified by the row address and the column address is read out. In the SDRAM 3A, on the other hand, since the logic of the write enable signal WE# is inverted by the inverter 36 and the switch 37, the column address is set (latched). In the embodiment, the read latency RCL of the transfer origin is +2. The write latency WCL of the transfer destination is +2. Their numerical values are adjusted to the read latency of the transfer origin. At timing T5 to T8, data D1 to D4 on the data signal DQ are read out from the memory cell of the NV memory 4B, and are outputted on the data signal DQ in the data latency (RCL)=2. In the SDRAM 3A, on the other hand, the data signal DQ outputted from the NV memory 4B is written into the memory cell of the SDRAM 3A in the same data latency as data latency (WCL) =2. At timing T9, the chip select signal CS2# and the row address select signal RAS#, and the write enable signal WE# are at low level, and when the column address select signal CAS# is at high level, in the memory cell of the NV memory 4B, since the precharge signal PR comes to high level, the precharge operation is carried out. In the SDRAM 3A, too, the precharge signal PR comes to high level, and the precharge operation is executed.

The data signal DQ thus being read out from the NV memory 4B is written into the SDRAM 3A. Therefore, the SDRAM controller 2 outputs a read command to the SDRAM 3A and the NV memory 4B connected to a common command bus, and the data can be written back (shadow-transferred) from the NV memory 4B to the SDRAM 3A. Accordingly, data recovery of the SDRAM 3A after the DPD Exit can be executed at high speed by the shadow transfer function, and the access entry of the SDRAM 3A can be started at high speed. Since the buffer is not used in the data signal DQ, control of memory access can be simplified. Further, the circuit configuration around the data signal is simple, and data transfer delay or power consumption can be curtailed. In the system level, too, starting after resetting the DPD is also at high speed. Specifically, as for latest application programs and data before DPD entry entered in the SDRAM 3A, the SDRAM controller 2 can reset the system at high speed by reading out the data from the NV memory 4B. Moreover, since the data being read out from the NV memory 4B to the SDRAM controller 2 is simultaneously written into the SDRAM 3A, it is not necessary to output data write command newly from the SDRAM controller 2 to the SDRAM 3A. These concepts of invention are not limited to the system recovery after DPD, but are also applied in various system applications such as high speed system restart at the time of OS updating.

Embodiment 4

Figure 10:
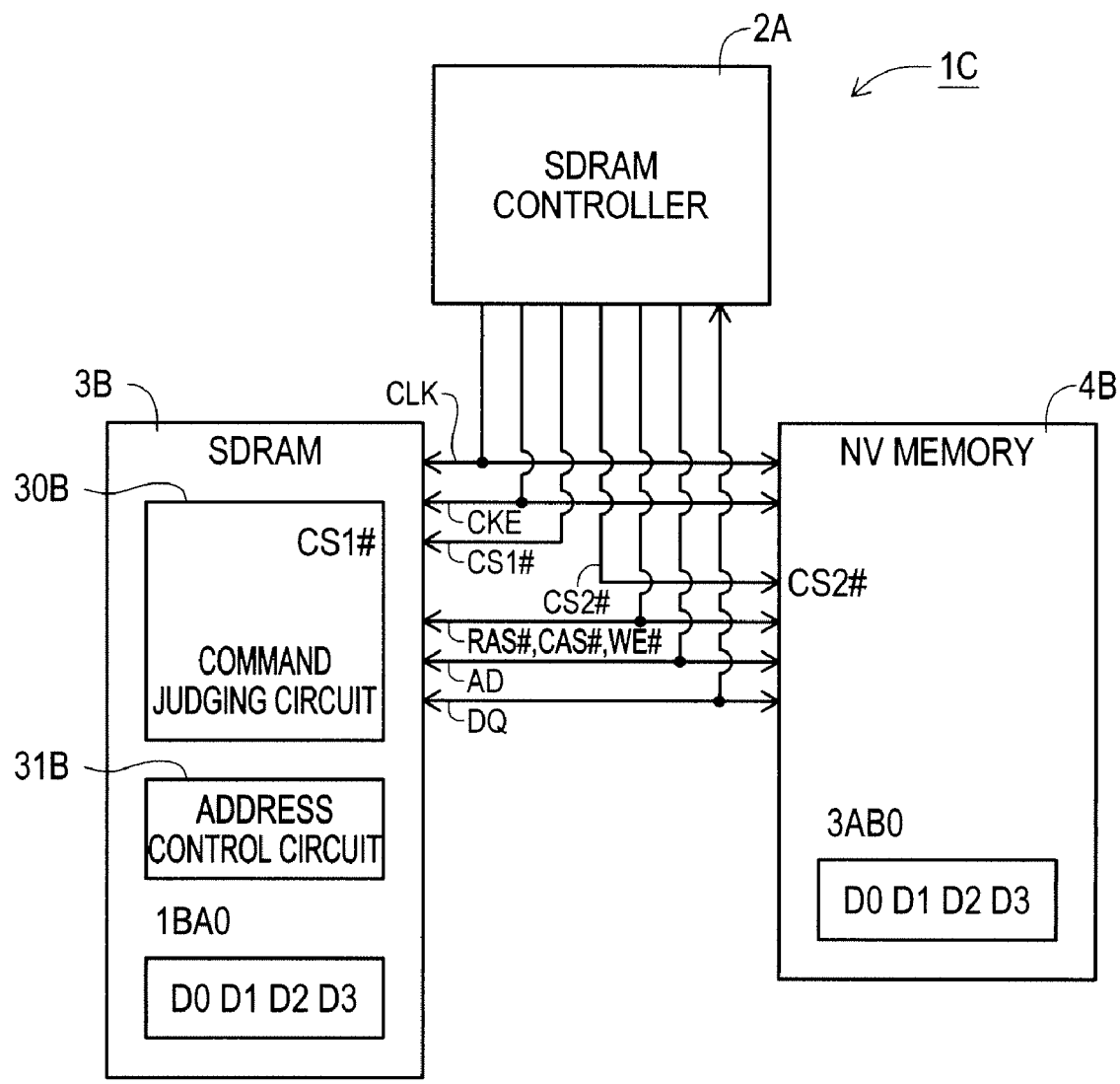
FIG. 10 is a block diagram of a memory system according to an embodiment 4.

FIG. 10 is a block diagram of memory system 1C in the embodiment 4. The memory system 1C includes an SDRAM controller 2A, an SDRAM 3B, and an NV memory 4B. In the memory system 1C, the SDRAM controller 2A, SDRAM 3B, and NV memory 4B are connected directly with each other by way of various clock signals, command signals, address signal AD, and data signal DQ. The NV memory 4B has a command judging circuit not shown, for accessing the NV memory cell by decoding commands outputted from the SDRAM controller 2A, that is, the row address select signal RAS#, column address select signal CAS#, and write enable signal WE#. The SDRAM 3B has a function of writing the data being read out from the NV memory 4B into various addresses. This function is realized by the command judging circuit 30B and address control circuit 31B.

Figure 11:
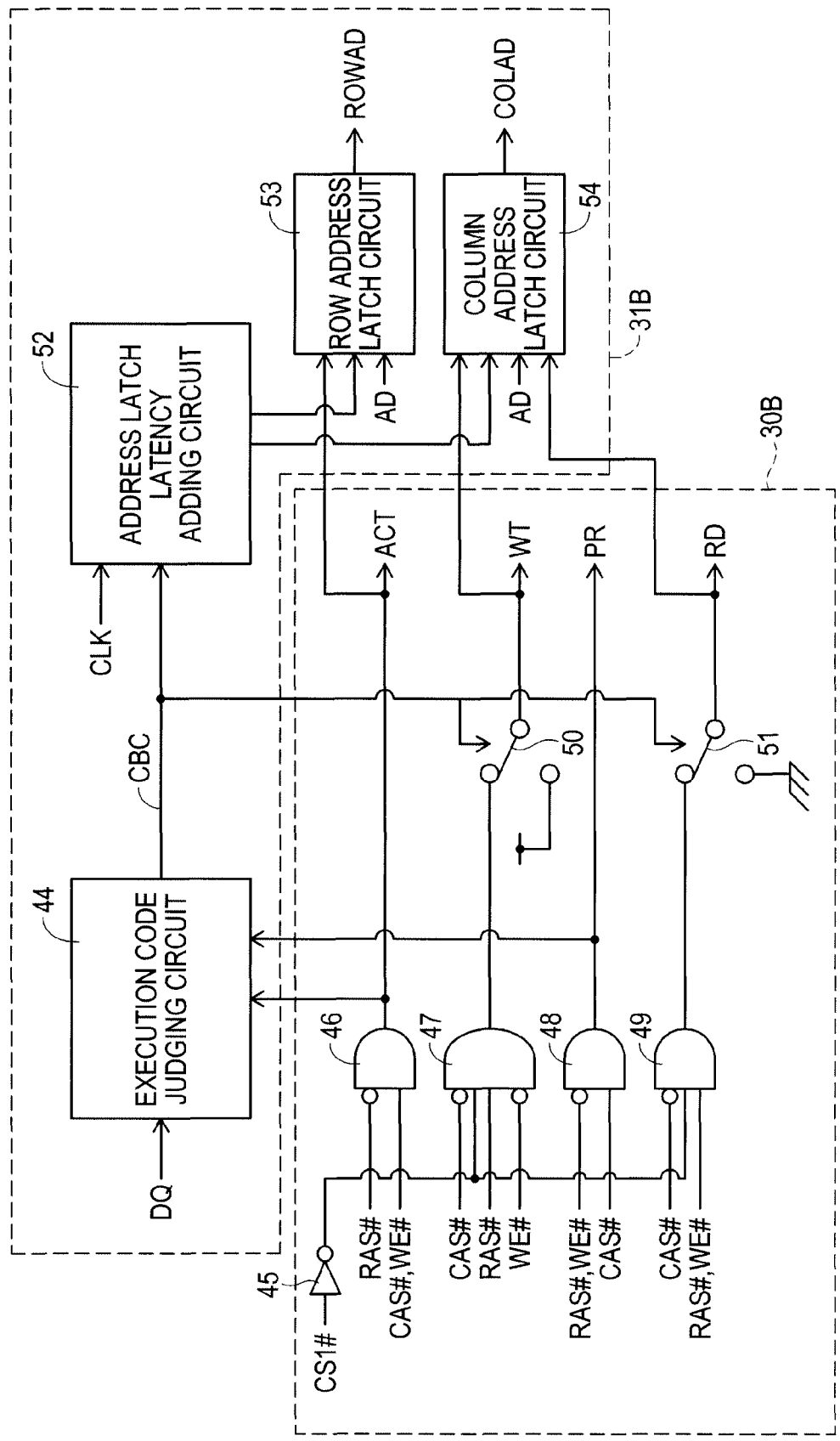
FIG. 11 is a circuit diagram showing an example of a command judging circuit and an address control circuit according to the embodiment 4.

FIG. 11 shows an example of a circuit diagram of the command judging circuit 30B and address control circuit 31B provided in the SDRAM 3B. The command judging circuit 30B includes an inverter 45, AND gates 46 to 49, and switches 50, 51. The address control circuit 31B includes an execution code judging circuit 44, an address latch latency adding circuit 52, a row address latch circuit 53, and a column address latch circuit 54. The inverter 45 outputs an inversion signal of the chip select signal CS1#. That is, the SDRAM 3B is selected, and when the chip select signal CS1# comes to low level, a high level is outputted. At the AND gate 46, while the row address select signal RAS# is at low level, and when the column address select signal CAS# and write enable signal WE# come to high level, its output or the active signal ACT comes to high level. At the AND gate 47, while the chip select signal CS1# is at low level, and when the column address select signal CAS# and write enable signal WE# come to low level, and the row address select signal RAS# comes to high level, its output comes to high level. In the switch 50, when the execution code judging signal CBC described below is at low level, the output of the AND gate 47 is outputted to the write signal WT, and when the execution code judging signal CBC is at high level, a high level pulse is forced to be outputted to the write signal WT. At the AND gate 48, when the row address select signal RAS# and write enable signal WE# come to low level, and the column address select signal CAS# comes to high level, its output or the precharge signal PR comes to high level. At the AND gate 49, while the chip select signal CS1# is at low level, and when the column address select signal CAS# comes to low level, and the row address select signal RAS# and write enable signal WE# come to high level, its output comes to high level. In the switch 51, when the execution code judging signal CBC described below is at low level, the output of the AND gate 49 is outputted to the read signal RD, and when the execution code judging signal CBC is at high level, a low level is outputted to the read signal RD.

The address control circuit 31B is described below. In the execution code judging circuit 44, the data signal DQ, the active signal ACT, and the precharge signal PR are inputted. When the active signal ACT comes to high level, the execution code CMD outputted to the data signal DQ is acquired. The execution code CMD determines whether or not to add the latency of the address. If the data transfer origin and the transfer destination are different depending on the execution code CMD, the execution code judging signal CBC is set to high level. When the precharge signal PR comes to high level, the execution code judging signal CBC is set to low level. In the address latch latency adding circuit 52, clock signal CLK and execution code judging signal CBC are inputted. When the execution code judging signal CBC is at high level, a control signal for adding latency to the address is outputted in the row address latch circuit 53 and column address latch circuit 54. The value of latency of address to be added may be 1 or more than 1. When the execution code judging signal CBC is at low level, the latency value of address is 0. The value of latency may be predetermined in a mode register setting cycle.

In the row address latch circuit 53, the active signal ACT, the address latency control signal from the address latch latency adding circuit 52, and the address signal AD are inputted. When the active signal ACT comes to high level, the row address is latched and the row address ROWAD are outputted at the address latency corresponding to the address latency control signal from the address latch latency adding circuit 52. In the column address latch circuit 54, the write signal WT, read signal RD, address latency control signal from the address latch latency adding circuit 52, and address signal AD are inputted. When the write signal WT comes to high level, the column address is latched and the column address COLAD are outputted at the address latency corresponding to the address latency control signal from the address latch latency adding circuit 52. When the read signal RD is at high level, the address latency is 0, and the address signal AD is latched. The write control circuit (not shown) of the NV memory 4B is explained. As described below, write data of the NV memory 4B latches the read data of the SDRAM 3B. Hence, the write latency of the NV memory 4B (number of clocks CLK specified from command to latching of the write data) is same as the read latency of SDRAM 3B at transfer origin. The data latch latency adding circuit included in the write control circuit of the NV memory 4B is of the same system as that of the address latch latency adding circuit 52, that is, the execution code judging signal CBC and the clock signal CLK of the execution code judging circuit 44 are inputted, and the data latch circuit (not shown) is controlled.

Figure 12:
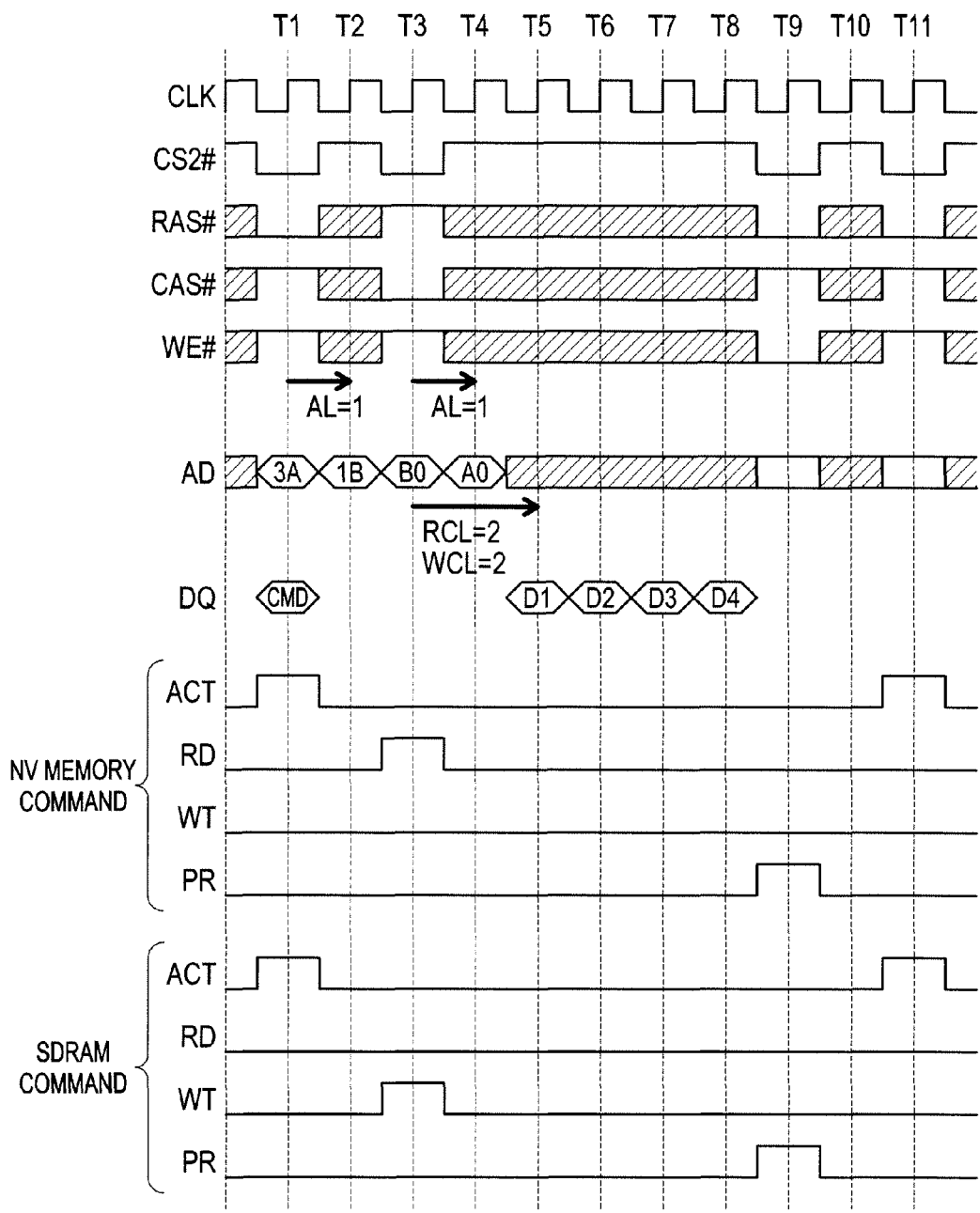
FIG. 12 is a timing chart showing an operation of the memory system of FIG. 10 according to the embodiment 4.

With reference to FIG. 12, the operation of the memory system 1C is explained. FIG. 12 is a timing chart of the operation of the memory system 1C. The clock signal CLK, the chip select signal CS2#, the row address select signal RAS#, the column address select signal CAS#, the write enable signal WE#, the address signal AD, and the data signal DQ are signals connected to the SDRAM controller 2. In the middle stage, the active signal ACT, the read signal RD, the write signal WT, and the precharge signal PR are signals showing the memory commands of the NV memory 4B. In the lower stage, the active signal ACT, the read signal RD, the write signal WT, and the precharge signal PR are signals showing the memory commands of the SDRAM 3B.

At timing T1, when the chip select signal CS2# and the row address select signal RAS# are at low level, and the column address select signal CAS# and the write enable signal WE# are at high level, the active signal ACT of the SDRAM 3B comes to high level. At the same time, the execution code CMD outputted to the data signal DQ is acquired. In the embodiment, the address latency AL of the transfer destination is +1. The read latency RCL of the transfer origin is +2. The write latency WCL of the transfer destination is +2, and this numerical value is added to the read latency RCL of the transfer origin. The active signal ACT of the NV memory 4B comes to high level. As a result, in the NV memory 4B, the row address 3A is set (latched). At timing T2, since the address latency of the transfer destination is 1, in the SDRAM 3B, the row address 1B is set (latched) at the timing delayed by 1 CLK from the active signal ACT. At timing T3, the chip select signal CS2# and the column address select signal CAS# are at low level, and when the row address select signal RAS# and the write enable signal WE# come to high level, the read signal in the NV memory 4B comes to high level. As a result, the column address B0 of the NV memory 4B is set (latched). In the SDRAM 3B, on the other hand, since the execution code judging signal CBC is at high level, the write signal WT is set to high level. In the embodiment, since the read latency of the NV memory 4B is set at 2, two cycles later (T5), data of the NV memory 4B is outputted on the data signal DQ.

At timing T4, since the address latency of the transfer destination is 1, in the SDRAM 3B, the column address A0 is set (latched). The transfer destination address can be established in the same cycle (T2, T4) of the transfer origin address by the address latency technology. At timing T5 to T8, the stored data D1 to D4 are read out from the address 3AB0 in the NV memory 4B, sequentially by data latency (RCL)=2, and in the SDRAM 3B, data D1 to D4 are written simultaneously from the address 1BA0, by the same data latency as data latency (WCL)=2. At timing T9, the row address select signal RAS# and the write enable signal WE# are at low level, and the column address select signal CAS# is at high level, in the SDRAM 3B, the precharge signal PR comes to high level, and the execution code judging signal CBC comes to low level. Hence the SDRAM 3B returns to the ordinary operation. At timing T1, meanwhile, instead of the method of acquiring the execution code CMD outputted to the data signal DQ, according to the data transfer code set in the mode register, the other embodiment similar to the function of the embodiment 4 is also possible. In this case, the mode register is connected, instead of the data signal DQ, to the execution code judging circuit 44, and the execution code judging signal CBC is outputted. This embodiment does not require input connection of the active signal ACT and the precharge signal PR to the execution code judging circuit 44. When the SDRAM controller 2A transfers data from the NV memory 4B to the SDRAM 3B, a mode register setting command is outputted to the SDRAM 3B at least before issuing the read command to the NV memory 4B, and the data transfer mode is entered. Consequently, the SDRAM 3B is transferred to the data transfer mode, and the switches 50, 51 of the command judging circuit 30B, the address latch latency adding circuit 52 of the address control circuit 31B, and the data latch latency adding signal are controlled in the same manner as mentioned above. Upon completion of all data transfer, the SDRAM controller 2A outputs a mode register setting command to the SDRAM 3B, and cancels the data transfer mode.

As described herein, in the memory system 1C of the embodiment 4, data can be transferred from the NV memory 4B of mutually different address transfer origins to SDRAM 3B of the transfer destination by using one command from the SDRAM controller 2A, and without resort to the data buffer in the SDRAM controller 2A. The command judging circuit and chip select signal CS disclosed in the embodiment 1 to the embodiment 4 are described. The signal distinguishing the SDRAM from the NV memory is the chip select signal CS, and CS1 is assigned to the SDRAM, and CS2 is assigned to the NV memory. In the foregoing embodiments, when the memory controller accesses either one of the memory devices together with the CS signal, the other memory device operates in the same command cycle regardless of the CS, and mainly three functions are disclosed (shadow write function, shadow transfer function, and data transfer function), and the relation of the command judging circuit and the CS signal of both memory devices is disclosed. Not limited to this example, the following method is also simple, and is presented as an embodiment 5.

In the SDRAM command judging circuit, a chip select signal CS1 is inputted, and in the NV memory command judging circuit, a chip select signal CS2 is inputted. In the SDRAM, a mode register 1 for invalidating the chip select signal CS1 is provided, and in the NV memory, a mode register 2 for invalidating the chip select signal CS2 is provided. The mode register 1 is inputted to the command judging circuit of SDRAM, and the mode register 2 is inputted to the command judging circuit of the NV memory, and depending on each value, the signal of the mode register is added to the logic circuit for generating the active signal ACT, the write signal WT, and the precharge signal PR. When the mode register value is 0, the CS signal is valid, and hence ACT, WT and PR are generated by CS1 and each command. When the mode register value is 1, the CS signal is invalid, and hence ACT, WT and PR are generated only by each command. The memory controller, when making use of these three functions (shadow write function, shadow transfer function, and data transfer function), only adds the cycle of setting (1)/canceling (0) of the mode register before and after the function.

For example, on the basis of the data transfer mode of the embodiment 4, when only the mode register 1 is set, the SDRAM generates internal signals of ACT, WT, and PR by each command regardless of the CS signal, and the NV memory generates the CS signal and internal signals of ACT, WT, and PR by each command. By issuing the active command, the read command, and the precharge command for read access from the memory controller to the NV memory, the NV memory executes the read operation of FIG. 12, and the SDRAM executes the write operation of FIG. 12. The execution code judging circuit CBC inputted to the switch 50, the switch 51, and the address latch latency adding circuit 52 for generating the write signal WT by force in the embodiment 4 is exchanged with the mode register signal, and is controlled by the mode register. Hence, the execution code judging circuit 44 is not needed.

Modified examples of the embodiments are explained below. In the embodiment 1, the chip select signal CS1# to the OR gate 20 is exchanged with the mode register signal, thereby deleting the negative logic element attached to the input unit of the OR gate corresponding to the mode register signal. In the embodiment 2, the mode register signal is additionally inputted to the individual logic gates (AND gates 27 to 29) for generating ACT_SD, WT_SD, PR_SD, and is controlled by the mode register. In the embodiment 3, the switch 37 internally inverting the write enable signal WE# or not is also controlled by the mode register. The output of the shadow write period setting circuit 35 inputted to the OR gate 38 is exchanged with the signal of the mode register. As a result, the shadow write period setting circuit 35 is not needed. By these means, the command judging circuit and its function in the embodiment 1 to the embodiment 3 operate similarly. A great caution is needed when adding the logic of the mode register for invalidating the chip select signal CS to generation of the read signal RD. There is a risk of bus fight on the data signal DQ of the system. Such risk may be evaded by adding the chip select signal CS to the I/O control of each memory device. The memory controller of the invention is explained below together with the assembly package form of plural memory devices. The NV memory and the SDRAM are preferred to be the MCP package or package-on-package (POP) contained in a same package. This is because the parasitic LCR component of the package is smaller, and data transfer between the NV memory and the SDRAM is realized at high speed.

The invention is not limited to these embodiments, but may be changed or modified in various modes within the true spirit of the invention. For example, in the embodiment 4, the address control circuit 31B is provided at the SDRAM 3B side, and data is transferred from the NV memory 4B to the SDRAM 3B, but an address control circuit may be provided at the NV memory 4B side, and data may be transferred from the SDRAM 3B to the NV memory 4B. In the embodiment 4, when the active signal ACT is at high level, the execution code CMD is outputted to the data signal DQ, and the transfer command is defined, but the invention may be also applied in other combination of pins. The command judging circuit disclosed in the embodiment 1 to the embodiment 4 is intended to explain the embodiments briefly, and the detailed logic and timing adjustment are omitted so far as the invention is not misunderstood. Meanwhile, the SDRAM controller 2 and the SDRAM controller 2A are examples of the memory controller, the NV memory 4, the NV memory 4A, and the NV memory 4B are examples of the first memory device, the SDRAM 3, the SDRAM 3A, and the SDRAM 3B are examples of the second memory device, the shadow write period setting circuit 35 is an example of the write period signal generating circuit, the OR gate 38 is an example of the chip select invalidating circuit, the inverter 36 and the switch 37 are examples of the write signal control circuit, and the address judging circuit 34 is an example of address judging circuit.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. A memory system comprising:
a memory controller for outputting a command signal and an address signal and for inputting and outputting a data signal,
a first memory device for inputting the command signal and the address signal from the memory controller, wherein the first memory device comprises a deep power down command control circuit for stopping the first memory device, and a first command judging circuit for inputting and outputting the data signal and for decoding the command signal, and
a second memory device for inputting the command signal and the address signal from the memory controller, wherein the second memory device comprises a second command judging circuit for inputting and outputting the data signal and for decoding the command signal,
wherein the command signal, the address signal and the data signal are commonly connected to the first memory device and the second memory device; and wherein a first action of the first memory device and a second action of the second memory device commonly operate simultaneously in the same data latency and in the same cycle,
wherein the second memory device adds, in the case of a determined data transfer mode, a specified number to an address latency of the first memory device to obtain an address latency for the second memory device.

2. The memory system of claim 1, wherein both of the first action and the second action are a write operation.

3. The memory system of claim 2, wherein the first memory device has a partial write judging circuit for allowing a write operation only in a partial address space, depending on a partial write address information showing a partial data holding region of the second memory device.

4. The memory system of claim 3, wherein the first memory device has a mode register for holding the partial write address information by judging a specifying command of the partial data holding region.

5. The memory system of claim 2, wherein the deep power down command control circuit is configured to stop the first memory device after completion of a write operation of the first memory device.

6. The memory system of claim 5, wherein the deep power down command circuit notices stopping of the first memory device, and the memory controller controls the power source of the first memory device.

7. The memory system of claim 5, wherein information capable of stopping or having stopped the first memory device is stored in an internal state register, and the memory controller reads out the information in the internal state register and controls the power source of the first memory device according to the information.

8. The memory system of claim 2, wherein the first memory device has an address decoder for recognizing an address from the memory controller, and when the memory controller outputs a write access to the second memory device and the address, the second memory device executes a write operation and the first memory device is set to execute the write operation by the address decoder.

9. The memory system of claim 8, wherein the memory controller outputs an access command to the first memory device, together with an address information of an address space of the second memory device.

10. The memory system of claim 1, wherein the first action outputs the data signal and the second action inputs the data signal, both in the same data latency.

11. The memory system of claim 10, wherein the second memory device converts a read command to the first memory device into a write command of the second memory device, according to a preliminary mode register value.

12. The memory system of claim 10, wherein the memory controller outputs a deep power down termination, and the second memory device converts, in a specified time after the deep power down termination, a read command to the second memory device to a write command of the first memory device.

13. The memory system of claim 12, wherein the specified time is terminated by a precharge command issued by the memory controller.

14. The memory system of claim 13, wherein the specified time is terminated by reaching a pre-specified time established by the memory controller.

15. The memory system of claim 10, wherein the memory controller gives a transfer origin address of a read operation and a transfer destination address of a write address in the same cycle to the first memory device and the second memory device by different address latencies in the same cycle.

16. The memory system of claim 15, wherein the second memory device determines whether or not to activate a address latency by a mode register value preliminarily issued from the memory controller.

17. The memory system of claim 15, wherein a data transfer code of an address latency of the transfer origin address and the transfer destination address determines the data transfer mode by the combination of an active command and a data signal from the memory controller.

18. The memory system of claim 17, wherein the second memory device latches the address corresponding to the address latency of the second memory device to obtain an address for the transfer destination address, and converts a read command to the first memory device to a write command to the second memory device.

19. The memory system of claim 15, wherein the address latency value is established as the address latency value according to the mode register value on the basis of the mode register value preliminarily outputted from the memory controller.

20. The memory system of claim 10, wherein control of a address latency is terminated by a precharge command outputted by the memory controller.

21. The memory system of claim 2, wherein the memory controller outputs a mode register setting signal to the first memory device or the second memory device before or after issuing the command signal, and invalidates or validates a chip select signal.

22. The memory system of claim 1, wherein the first memory device and the second memory device are contained in an MCP package, or a package-on-package.

23. A memory device in a memory system composed of a memory controller and a plurality of memory devices, having a command signal, an address signal, and a data signal connected commonly, comprising:
a command recognition circuit for recognizing a specified command signal to other memory device out of the plurality of memory devices as a write command of own memory device, wherein a write data signal from the memory controller to the other memory device is sent to the own memory device in the same data latency and the same cycle to execute a write operation, and
a deep power down command judging circuit for judging a deep power down command,
a write period signal generating circuit for outputting a write period signal of a specified period after completion of the deep power down command of the memory device,
wherein a read data signal from the other memory device is sent to the own memory device in the same data latency and the same cycle to execute a write operation.

24. The memory device of claim 23, wherein the specified command signal is a write command or a read command.

25. The memory device of claim 24, wherein the command recognition circuit invalidates a chip select signal according to a mode register signal outputted by the memory controller.

26. The memory device of claim 24, wherein the own memory device has a partial write judging circuit for allowing a write operation only in a partial address space depending on a partial write address information showing a partial data holding region of the other memory device.

27. The memory device of claim 26, further comprising:
a partial write command judging circuit for judging the specified command of the partial data holding region of the other device; and
a mode register for holding the partial write address information.

28. The memory device of claim 24, further comprising a write control circuit for judging whether the own memory is in the process of writing or not, wherein the own memory device is stopped according to the deep power down command judging circuit and the write control circuit.

29. The memory device of claim 28, further comprising an own memory stop notice circuit for noticing stopping of the own memory.

30. The memory device of claim 28, further comprising an internal state register for storing information capable of stopping or having stopped the own memory device.

31. The memory device of claim 24, further comprising an address decoder for recognizing an address from the memory controller, wherein a write operation signal of the own memory device is generated, corresponding to an access object address of the other memory device.

32. The memory device of claim 24, wherein the command recognition circuit converts the read command into a write command according to a preliminary mode register value.

33. The memory device of claim 24, further comprising:
a chip select invalidating circuit for invalidating a chip select signal of the own memory device when the write period signal is outputted; and
a write signal control circuit for converting a read operation to the other memory device into a write operation of the own memory device when the write period signal is outputted.

34. The memory device of claim 33, wherein the specified period is terminated by a precharge command recognition signal of the command recognition circuit.

35. The memory device of claim 34, wherein the specified period is terminated by reaching a pre-specified period established in a mode register by the memory controller.

36. The memory device of claim 24, wherein a transfer origin address for a read operation to the other memory device, and a transfer destination address for a write operation to the own memory device are given in the same cycle by different address latencies, and wherein an address latch circuit for latching the transfer destination address includes an address latch latency circuit for delaying its latch timing at least by one external clock from the transfer origin address.

37. The memory device of claim 36, wherein a data transfer code of the address latency of the transfer origin address and the transfer destination address determines a data transfer mode by the combination of a active command and the data signal from the memory controller.

38. The memory device of claim 37, wherein the data transfer mode is terminated by the command recognition circuit in response to recognizing a precharge command outputted by the memory controller and the precharge command.

39. The memory device of claim 37, further comprising:
a data transfer code acquiring circuit for acquiring the data transfer code together with the active command outputted from the memory controller;
an address latency control circuit for adding to the latency of the address latch according to the data transfer code when the data transfer code is active;
an address latch circuit for latching the corresponding to the output of the address latency control circuit to obtain an address of the transfer destination address; and
a command control circuit for converting a read command to the other memory device into a write command to the own memory device when the data transfer code is active.

40. The memory device of claim 36, wherein a mode register preliminarily outputted from the memory controller is connected to the address latch latency circuit, and the address latency value is established according to its mode register value.

41. The memory device of claim 24, wherein a mode register is connected to the command recognition circuit or an address control circuit, and a data transfer mode (CBC) is established according its mode register value.

42. The memory device of claim 23, wherein the plurality of memory devices arc contained in an MCP package or a package-on-package.

43. A control method for issuing a specified command to a plurality of memory devices in a memory system, the plurality of memory devices comprising a first memory device and a second memory device connected to a single memory controller, comprising:

recognizing the specified command to the second memory device as a write command from a memory corresponding to the first memory device;

connecting a data signal from the memory controller and the second memory device;

sending the content of the data signal to the first memory device for allowing a write operation by the same data latency, judging a deep power down command from the memory controller;

judging whether or not the first memory device is in the process of writing; and outputting a write period signal of a specified period upon completion of deep power down of the first memory device.

44. The control method of memory devices of claim 43, wherein the recognizing the specified command comprises recognizing a write command to the second memory device as a write command to the first memory device and recognizing a read command to the second memory device as a write command to the first memory device.

45. The control method of memory devices of claim 44, further comprising invalidating a chip select signal of the first memory device according to a mode register signal issued by the memory controller.

46. The control method of memory devices of claim 44, further comprising determining an object address of the write operation on the first memory device according to a partial write address information showing a partial data holding region of the second memory device.

47. The control method of memory devices of claim 44, further comprising:
judging a specifying command of the partial data holding region of second memory device;
holding the partial write address information; and
determining an object address of the write operation on the first memory device according to the partial write address information.

48. The control method of memory devices of claim 44, further comprising:
stopping the first memory device in response to judging a deep power down command from the memory controller; and judging whether or not the first memory device is in the process of writing.

49. The control method of memory devices of claim 48, further comprising noticing, by the memory controller, the stopping of the first memory device.

50. The control method of memory devices of claim 48, further comprising storing the information capable of stopping or having stopped the first memory device in an internal state register according to the two foregoing steps.

51. The control method of memory devices of claim 44, further comprising:
recognizing an access object address of the second memory device, and
generating a write operation signal of the first memory device to the access object address of the second memory device.

52. The control method of memory devices of claim 44, further comprising:
converting the read command into a write command by the first memory device according to a preliminary mode register value.

53. The control method of memory devices of claim 44, further comprising:
invalidating a chip select signal of the first memory device when the write period signal is outputted; and
converting the read operation to the second memory device into a write operation of the first memory device when the write period signal is outputted.

54. The control method of memory devices of claim 53, wherein the specified period is terminated by a precharge command recognition step.

55. The control method of memory devices of claim 54, wherein the specified period is terminated by reaching a predetermined period established by the memory controller.

56. The control method of memory devices of claim 44, wherein a transfer origin address for a read operation to the second memory device, and a transfer destination address for a write operation to the first memory device are given in the same cycle by different address latencies.

57. The control method of memory devices of claim 56, wherein a data transfer code of the address latency of the transfer origin address and the transfer destination address determines a data transfer mode by recognizing the active command and the data signal from the memory controller.

58. The control method of memory devices of claim 57, further comprising:
recognizing a precharge command issued by the memory controller, and
terminating the data transfer mode by the recognizing the active command and the data signal from the memory controller.

59. The control method of memory devices of claim 57, further comprising:
acquiring the data transfer code together with an active command outputted from the memory controller;
adding to the address latency of an address latch according to the data transfer code when the data transfer code is active;
latching the address corresponding to the output of an address latency control circuit to obtain as an address for the transfer destination address; and
converting the read command to the second memory device into a write command to the memory corresponding to the first memory device, when the data transfer code is active.

60. The control method of memory devices of claim 56, further comprising establishing an address latency value according to a mode register value preliminarily issued from the memory controller.

61. The control method of memory devices of claim 44, further comprising establishing a data transfer mode (CBC) according to a mode register value preliminarily outputted from the memory controller.

* * * * *